(12) United States Patent
Kantarovsky et al.

(10) Patent No.: US 12,417,975 B2
(45) Date of Patent: Sep. 16, 2025

(54) ELECTRICALLY PROGRAMMABLE FUSE OVER CRYSTALLINE SEMICONDUCTOR MATERIALS

(71) Applicant: GlobalFoundries U.S. Inc., Malta, NY (US)

(72) Inventors: Johnatan A. Kantarovsky, South Burlington, VT (US); Santosh Sharma, Austin, TX (US); Michael J. Zierak, Colchester, VT (US); Steven J. Bentley, Menands, NY (US); Ephrem G. Gebreselasie, South Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 517 days.

(21) Appl. No.: 17/934,389

(22) Filed: Sep. 22, 2022

(65) Prior Publication Data

US 2024/0105595 A1  Mar. 28, 2024

(51) Int. Cl.
| | | |
|---|---|---|
| *H01L 23/525* | (2006.01) | |
| *H01L 21/76* | (2006.01) | |
| *H10D 30/01* | (2025.01) | |
| *H10D 30/47* | (2025.01) | |
| *H10D 62/85* | (2025.01) | |
| *H10D 62/852* | (2025.01) | |
| *H10D 84/01* | (2025.01) | |

(52) U.S. Cl.
CPC ...... *H01L 23/5256* (2013.01); *H01L 21/7605* (2013.01); *H10D 30/015* (2025.01); *H10D 30/475* (2025.01); *H10D 30/4755* (2025.01); *H10D 62/85* (2025.01); *H10D 62/8503* (2025.01); *H10D 62/852* (2025.01); *H10D 84/01* (2025.01)

(58) Field of Classification Search
CPC .............. H01L 23/5256; H10D 30/475; H10D 30/4755; H10D 30/015
See application file for complete search history.

(56) References Cited

U.S. PATENT DOCUMENTS

| | | |
|---|---|---|
| 9,214,461 B2 | 12/2015 | Cao et al. |
| 11,923,446 B2 | 3/2024 | Jain et al. |
| 2015/0318353 A1 | 11/2015 | Roberts et al. |

*Primary Examiner* — Grant S Withers
(74) *Attorney, Agent, or Firm* — Francois Pagette; Hoffman Warnick LLC

(57) ABSTRACT

Embodiments of the disclosure provide an electrically programmable fuse (efuse) over crystalline semiconductor material. A structure according to the disclosure includes a plurality of crystalline semiconductor layers. Each crystalline semiconductor layer includes a compound material. A metallic layer is on the plurality of crystalline semiconductor layers. The metallic layer has a lower resistivity than an uppermost layer of the plurality of crystalline semiconductor layers. A pair of gate conductors is on respective portions of the metallic layer. The metallic layer defines an electrically programmable fuse (efuse) link between the gate conductors.

20 Claims, 9 Drawing Sheets

ELECTRICALLY PROGRAMMABLE FUSE OVER CRYSTALLINE SEMICONDUCTOR MATERIALS

BACKGROUND

Field of the Invention

The present invention relates to integrated circuits (ICs) and, more particularly, to electrically programmable fuses (efuses).

Description of Related Art

Integrated circuit (ICs) incorporating III-V semiconductor materials, e.g., gallium nitride high electron mobility transistors (GaN HEMTs), may be implemented in specific settings such as in power conversion circuits. III-V semiconductor materials thus have emerged as a leading technology for power switching, radio frequency (RF) and millimeter wave (mmWave) (e.g., 3-300 GHz) wireless applications. HEMTs offer high conduction and low resistive losses in comparison to conventional silicon-based devices.

An electrically programmable fuse (efuse) is an electrical connection between two nodes that is configured to be destroyed in response to an electrical current, thus creating an open circuit between the two nodes. The effectiveness and reliability of efuses and other device components depend partially on each component's ability to resist or prevent intended degradation from sources other than electrical current, e.g., gradual electromigration degradation. In some cases, efuses may be difficult to integrate into circuits that have components with fundamentally distinct device architectures.

SUMMARY

All aspects, examples and features mentioned herein can be combined in any technically possible way.

Embodiments of a structure disclosed herein provide a structure including: a plurality of crystalline semiconductor layers, wherein each crystalline semiconductor layer includes a compound material; a metallic layer on the plurality of crystalline semiconductor layers, wherein the metallic layer has a lower resistivity than an uppermost layer of the plurality of crystalline semiconductor layers; and a pair of gate conductors on respective portions of the metallic layer, wherein the metallic layer defines an electrically programmable fuse (efuse) link between the gate conductors.

Some embodiments of a structure disclosed herein provide an electrically programmable fuse (efuse) structure for a III-V semiconductor substrate, the efuse structure including: a crystalline aluminum gallium nitride (AlGaN) layer at least partially on an isolation layer and above the III-V semiconductor substrate; a crystalline gallium nitride (GaN) layer on the crystalline AlGaN layer; a titanium nitride (TiN) layer on the crystalline GaN layer; and a pair of gate conductors on respective portions of the TiN layer, wherein the TiN layer defines an electrically programmable fuse (efuse) link between the gate conductors.

Additional embodiments of a structure disclosed herein provide a method including: forming a plurality of crystalline semiconductor layers, wherein each crystalline semiconductor layer includes a compound material; forming a metallic layer on the plurality of crystalline semiconductor layers, wherein the metallic layer has a lower resistivity than an uppermost layer of the plurality of crystalline semiconductor layers; and forming a pair of gate conductors on respective portions of the metallic layer, wherein the metallic layer defines an electrically programmable fuse (efuse) link between the gate conductors.

Another aspect of the disclosure includes any of the preceding aspects, and wherein a resistivity of the metallic layer is less than a resistivity of the uppermost layer of the plurality of III-V semiconductor layers.

BRIEF DESCRIPTION OF THE DRAWINGS

The present invention will be better understood from the following detailed description with reference to the drawings, which are not necessarily drawn to scale and in which.

DETAILED DESCRIPTION

Integrated circuit (ICs) for implementing complex functions may include alternatingly doped semiconductor regions in various configurations. One type of configuration is a "triple well" structure, featuring a doped well instead of a deep well and various shallow wells inside of the well. These wells may have p-type and n-type doping, e.g., to provide opposite polarity metal oxide semiconductor field effect transistors (MOSFETs) in close proximity within a device layer. These features, while favorable for MOSFETs and similar devices, may present drawbacks when used for other types of devices. Electrically programmable fuses ("efuses"), in a triple well structure or similar configuration, require a significantly larger surface area to operate due to the wide variety of doping polarities and concentrations in a device. An efuse is an electrical connection between two nodes that is configured to degrade in response to an electrical current, thus creating an open circuit between the two nodes. In triple well structures featuring efuses, the resistance of the open circuit may not be predictable and thus may pose reliability concerns.

Embodiments of the disclosure provide an electrically programmable fuse structure over crystalline semiconductor layers, e.g., those used in III-V semiconductor structures such as high electron mobility transistors (HEMTs). Embodiments of the disclosure thus integrate efuse technology with structures featuring various types of transistors and/or other components where efuses have not previously been implemented. A structure according to the disclosure may include a plurality of crystalline semiconductor materials, each of which may include a compound material (e.g., a combination of semiconductor and metal material(s) as discussed herein). A metallic layer may be on the plurality of crystalline semiconductor materials and may feature a lower resistivity than an uppermost layer of the plurality of crystalline semiconductor layers. A pair of gate conductors may be on respective portions of the metallic layer, such that the metallic layer defines an efuse link between the gate conductors. During operation, transmitting a minimum current from one gate conductor to the other may destroy (i.e., "program") the efuse, thus preventing further passage of current through the efuse structure.

Figure 1:
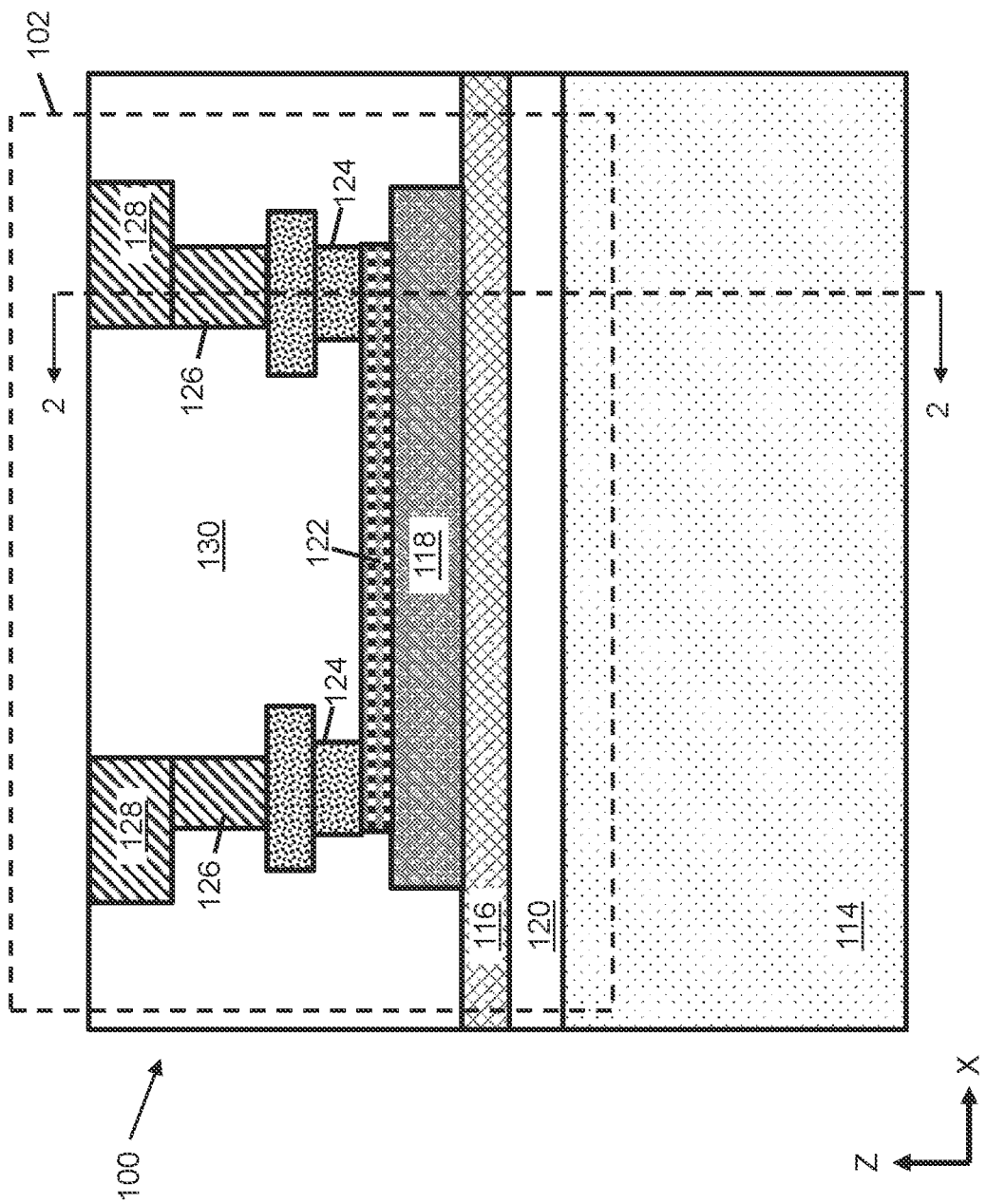
FIG. 1 depicts a first cross-sectional view in plane X-Z of a structure according to embodiments of the disclosure.

FIG. 1 shows a cross-sectional view of a structure 100 including an efuse 102 in a gallium nitride (GaN) technology setting, i.e., for an III-V integrated circuit, according to embodiments of the disclosure. Efuse 102 may be used in any III-V integrated circuit structure in which a selectively programmable conductive coupling finds application. Structure 100 and efuse 102 can be formed on a III-V semiconductor substrate, e.g., a gallium nitride (GaN) heterojunction structure including a barrier layer and a doped crystalline layer (e.g., configured for use as, or within, the channel layer of a transistor structure). More particularly, structure 100 and efuse 102 can include multiple epitaxially grown semiconductor layers on a semiconductor substrate 114. Semiconductor substrate 114 can be, for example, a silicon or silicon-based substrate (e.g., a silicon carbide (SiC) substrate), a sapphire substrate, a III-V semiconductor substrate (e.g., a gallium nitride (GaN) substrate or some other suitable III-V semiconductor substrate), a silicon substrate (perhaps doped p-type), or any other suitable substrate for a III-V semiconductor device. Epitaxially grown semiconductor layers on substrate 114 can include, for example: a barrier layer 116 above the top surface of semiconductor substrate 114 and a doped crystalline layer 118 on barrier layer 116. Barrier layer 116 in some cases may include aluminum gallium nitride (AlGaN) or any other material suitable for use as a barrier layer in a high electron mobility transistor. Where barrier layer 116 includes AlGaN, barrier layer 116 may have an Al mole fraction of between approximately fifteen percent and approximately twenty-five percent.

An isolation layer 120 can vertically separate one or more portions of semiconductor substrate 114 and barrier layer 116 from each other. Isolation layer 120 may include, e.g., any currently known or later developed dielectric material (e.g., silicon dioxide (SiO$_2$) or any other suitable isolation material) capable of being formed as a layer at least partially on semiconductor substrate 114. In some cases, isolation layer 120 may include various dopants, e.g., as an effect of doping semiconductor substrate 114 and/or any layers positioned thereover. In further implementations, isolation layer 120 may include one or more amorphizing dopant species (e.g., amorphous silicon (Si), argon (Ar), and/or other species configured to modify the crystal structure of semiconductor material). Such species may be embedded within isolation layer 120, e.g., as a structural artifact of processes to form crystalline semiconductor layers such as barrier layer 116 and/or doped crystalline layer 118 thereover.

In still further implementations, additional crystalline semiconductor layers may be on or included within semiconductor substrate 114, barrier layer 116, and/or doped crystalline layer 118. For instance, one or more buffer layers (not shown) may be on semiconductor substrate 114 to enhance the forming of additional semiconductor material layers thereon. Where included, such buffer layers could be, for example, a gallium nitride (GaN) buffer layer, an aluminum nitride (AlN) buffer layer, or a buffer layer of any other material suitable for use as a buffer layer of a III-V semiconductor device. Buffer layers, more specifically, can be employed to facilitate growth of barrier layer 116 and/or doped crystalline layer 118 and to provide for lattice constants of semiconductor substrate 114 below and doped crystalline layer 118 above. Buffer layers, where included, can be doped or undoped with any currently known or later developed dopant species (e.g., carbon doping).

The crystalline semiconductor layers of structure 100 can be, for example, III-V semiconductor layers. Those skilled in the art will recognize that a III-V semiconductor refers to a compound obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). Barrier layer 116 can have a band gap that is wider than the bandgap of doped crystalline layer 118. As discussed in further detail elsewhere herein, such materials may be selected to form a heterojunction in desired locations, e.g., to produce two-dimensional electron gas (2DEG) regions for enabling the operation of a transistor structure (e.g., high electron mobility transistor (HEMT) structure) within structure 100. In any case, the above-mentioned layers can be epitaxially grown by metal-organic chemical vapor deposition (MOCVD) or any other suitable technique (e.g., molecular beam epitaxy (MBE), hydride vapor phase epitaxy (HYPE), etc.). Furthermore, any one or more of the above-noted layers 116, 118, could be multi-layered structures (e.g., comprising multiple sub-layers of different buffer materials, multiple sub-layers of different III-V semiconductor channel materials and/or multiple sub-layers of different barrier materials).

A metallic layer 122 including, e.g., titanium nitride (TiN) and/or any currently known or later developed semiconductor-metal composition, may be on doped crystalline layer 118. Metallic layer 122 may extend horizontally between a pair of gate conductors 124, each defining a respective cathode and anode terminal of efuse 102. Although gate conductors 124 of efuse 102 do not function as transistor gates in efuse 102, they may include one or more materials that are used elsewhere in structure 100, and/or may be formed as part of the same process, as materials defining the gate terminal of one or more transistors as discussed elsewhere herein. As will also be discussed in further detail herein, metallic layer 122 may be substantially smaller in horizontal width than doped crystalline layer 118 and/or may also have a smaller width than gate conductor(s) 124. A set of contacts 126 (e.g., metal wires or vias) on gate conductors 124 may electrically couple efuse 102 to other structures or devices, including a set of conductors 128. Conductors 128 may include or otherwise may be coupled to wires and/or vias in overlying metal level layers (not shown).

Metallic layer 122 may be structured such that current generally passes from one gate conductor 124 to another through metallic layer 122 without significant impedance. Although metallic layer 122 may include TiN as discussed herein, metallic layer 122 additionally or alternatively may include any composition having a resistivity that is less than that of doped crystalline layer 118 (or any other semiconductor layer) thereunder. Thus, metallic layer 122 conducts current from one gate conductor 124 to another, rather than directing a significant amount of current through underlying semiconductor material(s). Metallic layer 122, additionally, may be entirely over isolation layer 120 to prevent any current therein from connecting to other structures through semiconductor substrate 114 and/or any crystalline semiconductor layers thereon. The passage of at least a minimum current through efuse structure 102, however, may increase the thermal energy within metallic layer 122, thereby destroying a portion of metallic layer 122 between gate conductors 124 when at least the minimum current passes therethrough. Metallic layer 122 thus defines a fuse link within efuse 102, in that metallic layer 122 may be electrically destroyed to decouple gate conductors 124 from each other without affecting other portions of structure 100. These properties of metallic layer 122 may arise from, e.g., metallic layer 122 being narrower in size yet longer in length than other portions of structure 100 having the same or similar composition. Thus, efuse structure 102 is capable of being programmed during the operation of structure 100.

Structure 100 and efuse 102 further may include one or more middle-of-the-line (MOL) dielectric layers 130. The MOL dielectric layer(s) 130 can cover and, particularly, can have a bottom surface above and immediately adjacent to efuse 102 and its subcomponents, as well as any other features over semiconductor substrate 114. MOL dielectric layer(s) 130 can include, for example, an etch stop material and a blanket interlayer dielectric (ILD) material layer on the etch stop layer. Etch stop materials can be, for example, a relatively thin conformal silicon nitride layer or a relatively thin conformal layer of some other suitable etch stop material. ILD materials can be, for example, a blanket layer of silicon dioxide, a doped silicon glass (e.g., phosphosilicate glass (PSG) or borophosphosilicate glass (BPSG)), or a blanket layer of any other suitable ILD material. The MOL dielectric layer(s) 130, as illustrated, can fill the space that is above metallic layer 122 of efuse 102 that extends laterally between gate conductors 124.

Figure 2:
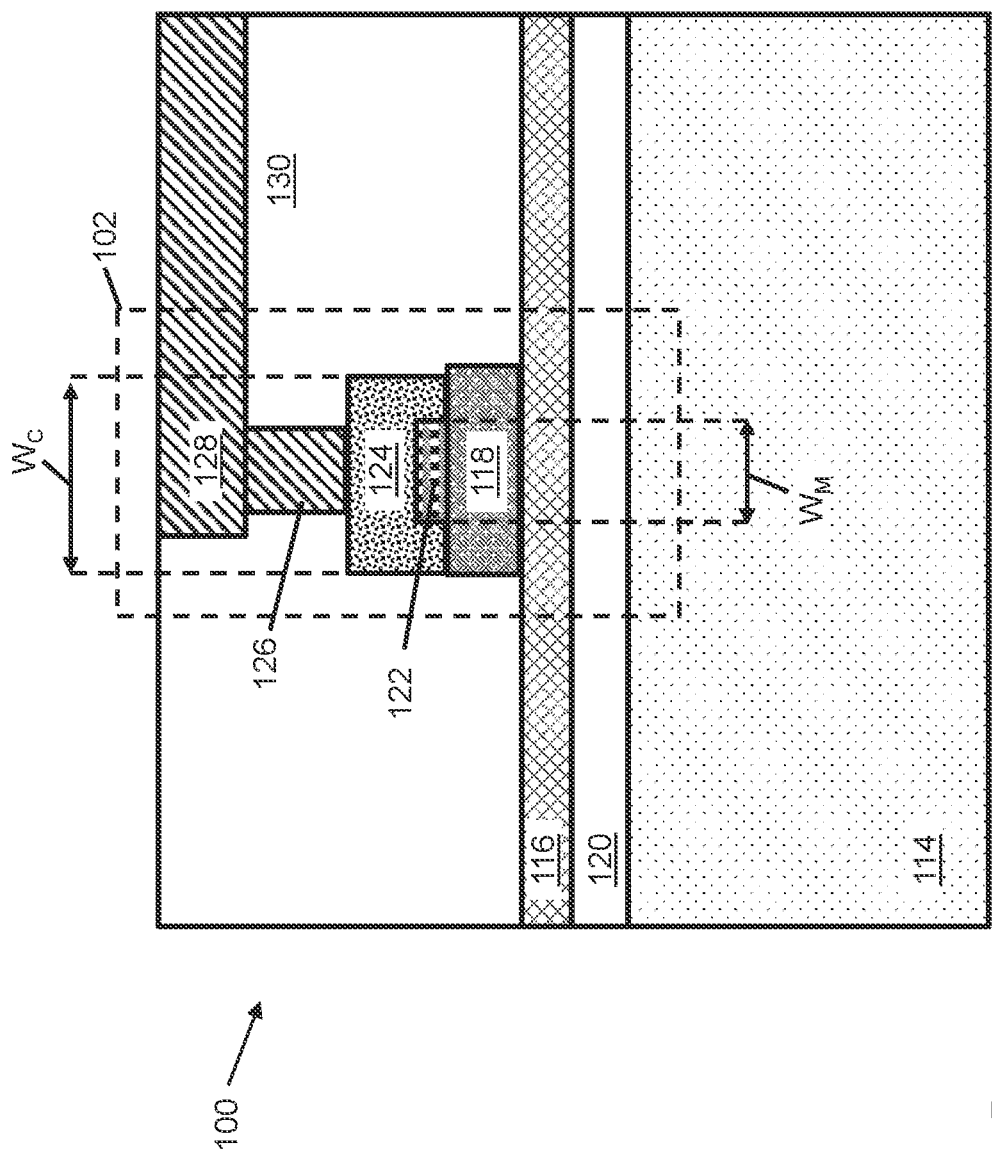
FIG. 2 depicts a second cross-sectional view in plane Y-Z of a structure, from view line 2-2 of FIG. 1, according to embodiments of the disclosure.

Turning briefly to FIG. 2, illustrating a cross-section of structure 100 and efuse 102 along view line 2-2 of FIG. 1, additional features of efuse 102 are described. Gate conductor 124 may have a width $W_C$ along the Y-axis direction that is greater than a width $W_M$ of metallic layer 122 along the same direction. This difference in width, in some implementations, may cause gate conductor 124 to be connected to metallic layer 118 through its upper surface(s) and sidewall(s), thereby increasing the amount of contact area between these two elements. In addition, metallic layer 122 having a narrower width along the Y-axis than gate conductor 124 may reduce the minimum current needed to destroy metallic layer 122 and thereby program efuse 102. The difference between widths $W_C$, $W_M$ may vary based on the intended application and/or technical setting of structure 100. It is understood that in further embodiments or implementations, width $W_C$ may be less than or approximately equal to width $W_M$.

Figure 3:
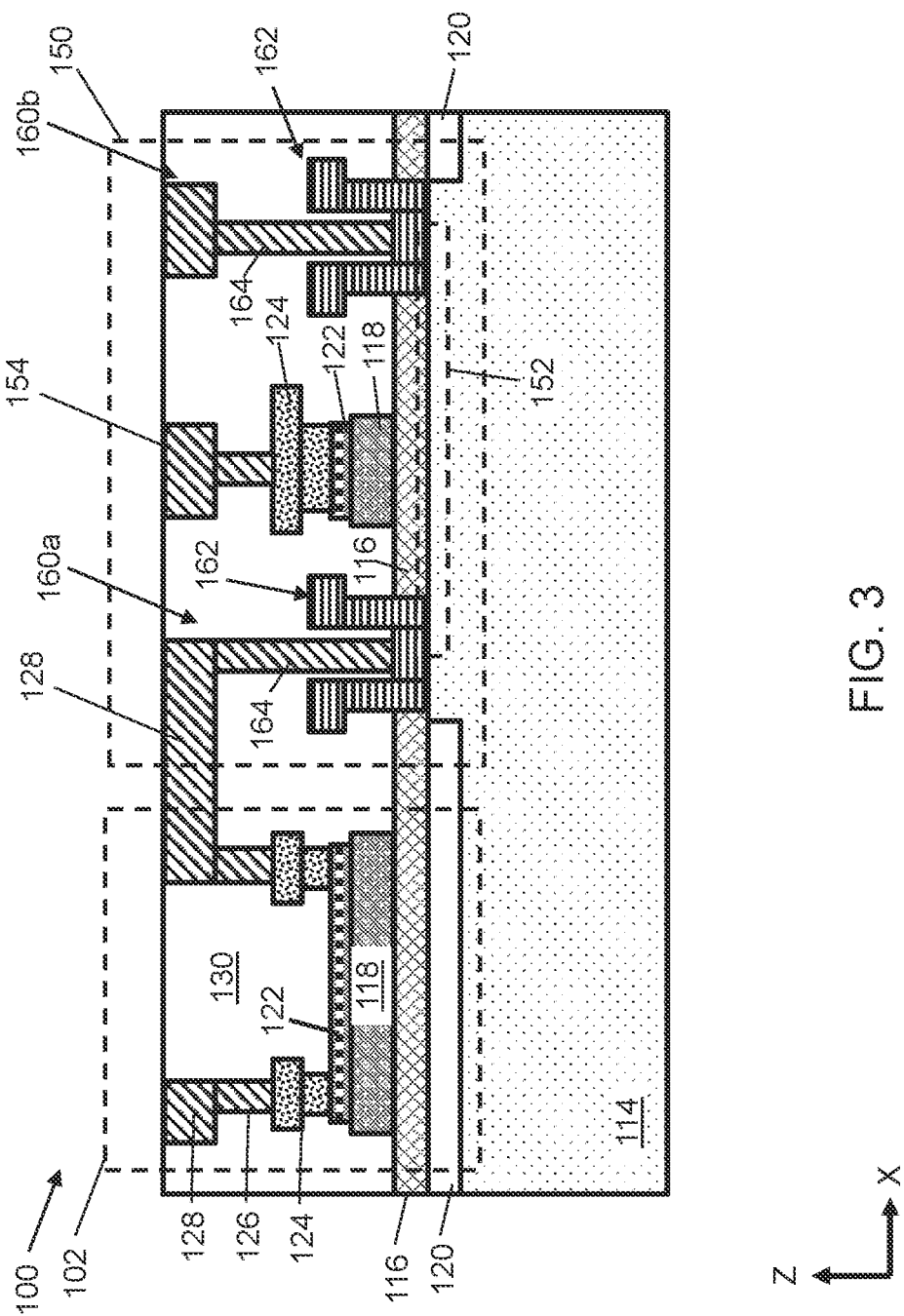
FIG. 3 depicts a cross-sectional view in plane X-Z of a structure and adjacent transistor according to embodiments of the disclosure.

Turning to FIG. 3, a cross-sectional view of structure 100 is shown according to further examples. Here, structure 100 includes efuse 102 and a transistor structure 150 adjacent efuse 102 over semiconductor substrate 114. Transistor structure 150 may be provided in the form of a high electron mobility transistor (HEMT) structure and/or other types of transistor structures capable of being formed on III-V semiconductor materials such as GaN or other semiconductor substrate 114 compositions discussed herein. In transistor structure 150, the composition of semiconductor substrate 114 and barrier layer 116 can be selected so that a heterojunction is formed at the interface between the two layers, thereby forming a two-dimensional electron gas (2DEG) region 152 in semiconductor substrate 114 (see dashed box). 2DEG region 152 in semiconductor substrate 114 can provide the conductive pathway for the drifting of charges between the source and the drain suitable for use in transistor structure 150 or, in more specific examples, an HEMT or metal-insulator-semiconductor HEMT (MISHEMT). Doped crystalline layer 118 may be on barrier layer 116 in transistor structure 150. Collectively, doped crystalline layer 118 and barrier layer 116 form a gallium nitride (GaN) heterojunction structure for operating transistor structure 150. Metallic layer 122 may be on doped crystalline layer 118 in transistor structure 150 but defines a vertical electrical coupling. Transistor structure 150 also may include gate conductor 124 coupled to barrier layer 116 through doped crystalline layer 118 and metallic layer 122. A gate contact 154 to gate conductor 124 defines a gate terminal for control of current flow through transistor structure 150. Metallic layer 122 will not operate as a fuse because it only has a single gate contact 154 thereto, and thus current does not pass laterally through metallic layer 122 in transistor structure 150.

Transistor structure 150 may be implemented in a variety of forms. A depletion-mode transistor refers to a device that allows current to pass from source to drain when the gate voltage is less than its pinch-off voltage but prevents current from passing from source to drain when the gate voltage meets or exceeds the pinch-off voltage. By contrast, an enhancement-mode transistor refers to a device that prevents current from passing from source to drain when the gate voltage is less than its threshold voltage (i.e., distinguishable from "pinch-off voltage" in the case of a depletion-mode transistor) but allows current flow from source to drain when the gate voltage meets or exceeds the transistor's threshold voltage. Embodiments of the disclosure integrate efuse 102 with transistor structure 150 regardless of whether transistor structure 150 includes depletion-mode (DMODE) or enhancement-mode structures (EMODE) therein. In the case of an EMODE device, transistor structure 150 may not include doped crystalline layer 118 and metallic layer 122 therein. Thus, FIG. 3 depicts transistor structure 150 by example as being a DMODE device.

In still further implementations, efuse 102 and/or transistor structure 150 may have distinct materials within barrier layer 116 apart from AlGaN to further distinguish their response to voltage biases during operation. In the case where gate barrier layer 116 includes AlGaN, additional doping of materials within transistor structure 150 may not be necessary, e.g., due to the intrinsic n-type doping of GaN. In this case, gate conductor 124 may have the same composition as any conductive contacts for source and/or drain contacts to transistor structure 150. In the case where transistor structure 150 is an enhancement-mode transistor, gate conductor 124 additionally may include doped crystalline layer 118 formed of pGaN. The presence of pGaN within doped crystalline layer 118 may cause transistor structure 150 to operate as an enhancement-mode transistor.

The electrical biasing of transistor structure 150 at gate contact 154 can affect whether current may flow between a set of source/drain terminals 160 of transistor structure 150. Source/drain terminals 160 are labeled separately as 160a, 160b in the accompanying FIGS. to indicate that either terminal may function as a source or drain of transistor structure 150. To define source/drain terminals 160a, 160b, structure 100 may include a set of ohmic contacts 162 on opposite horizontal ends of barrier layer 116, thus providing a physical interface between ohmic contacts 162 and 2DEG region 152. Ohmic contacts 162 include one or more metals configured for electrically interfacing with semiconductor materials(s) to define a metal-to-semiconductor Schottky diode within structure 100. Ohmic contacts 162 may be formed, e.g., by surface cleaning of semiconductor substrate 114, forming metal(s) on the cleaned surface, patterning, and annealing to create ohmic contacts 162 in desired positions. In the case where semiconductor substrate 114 includes GaN, ohmic contacts 162 may include composite materials of titanium (Ti), aluminum (Al), nickel (Ni), and gold (Au), or in another example may include palladium (Pd)/Au material. A set of source/drain (S/D) contacts 164 (e.g., metal wires or vias) on ohmic contacts 162 may electrically couple transistor structure 150 to other structures or devices, e.g., any of conductors 128. Conductors 128, in some cases, may couple one source/drain terminal 160a, 160b to the cathode or anode terminal of efuse 102.

Figure 4:
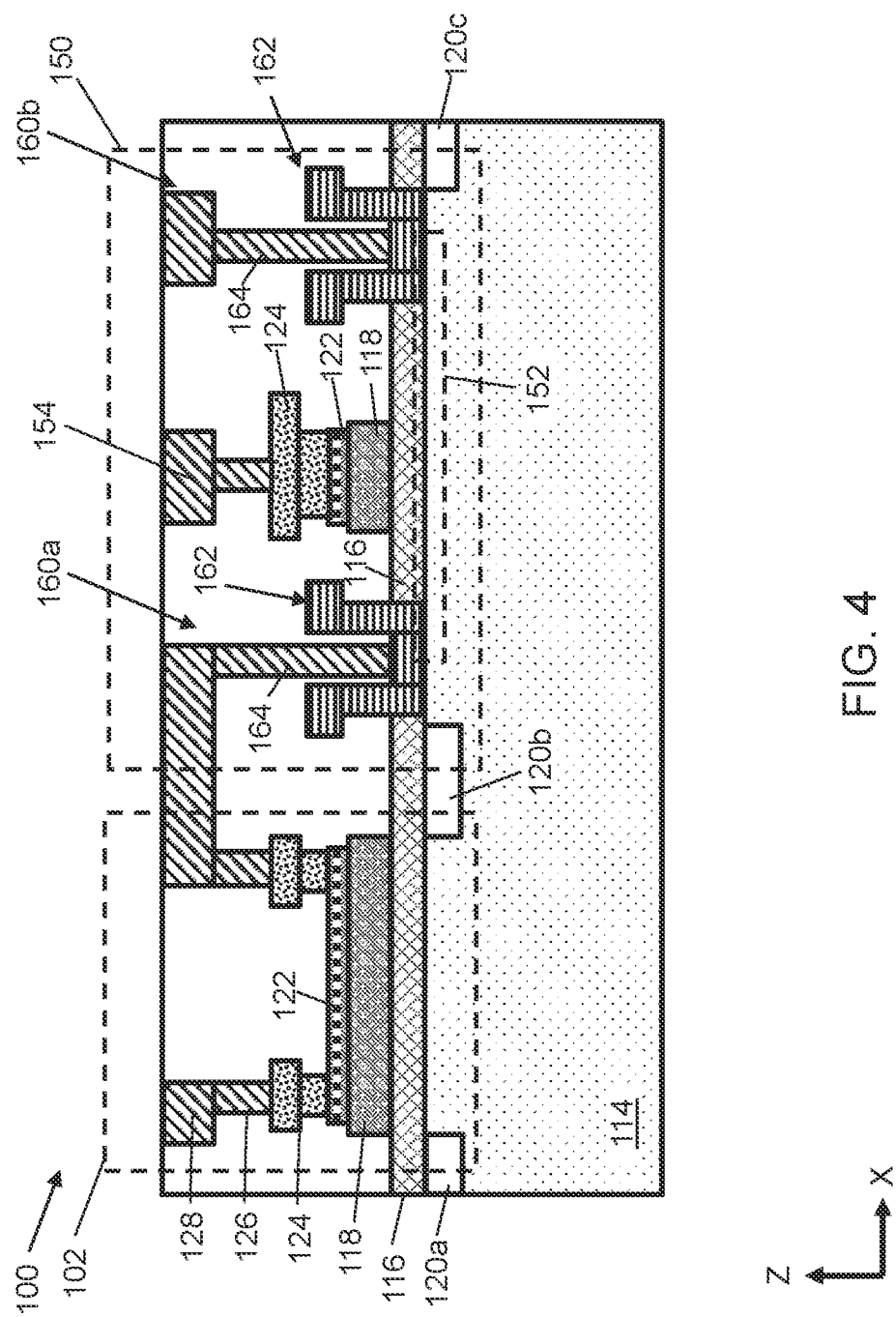
FIG. 4 depicts a cross-sectional view in plane X-Z of a structure and adjacent transistor according to further embodiments of the disclosure.

Turning briefly to FIG. 4, isolation layer 120 may be provided in a variety of shapes and positions in further embodiments. Although isolation layer 120 may extend entirely beneath metallic layer 122 in some embodiments (e.g., as shown in FIGS. 1-3) to prevent conductive pathways from forming through semiconductor substrate 114 below efuse 102, this is not necessarily required. In some cases, multiple isolation layers 120a, 120b, 120c can be within semiconductor substrate 114 to horizontally separate portions of semiconductor substrate 114 below efuse 102 from portions of semiconductor substrate 114 below transistor structure 150. Even where isolation layer(s) 120a, 120b, 120c extend only partially into semiconductor substrate 114, such a depth may be sufficient to stop current from flowing from efuse 102 to active portions of transistor structure 150, e.g., 2DEG region 152. In this case, a lower surface of barrier layer 116 below metallic layer 122 may physically interface with semiconductor substrate 114 without isolation layer 120 therebetween.

Figure 5:
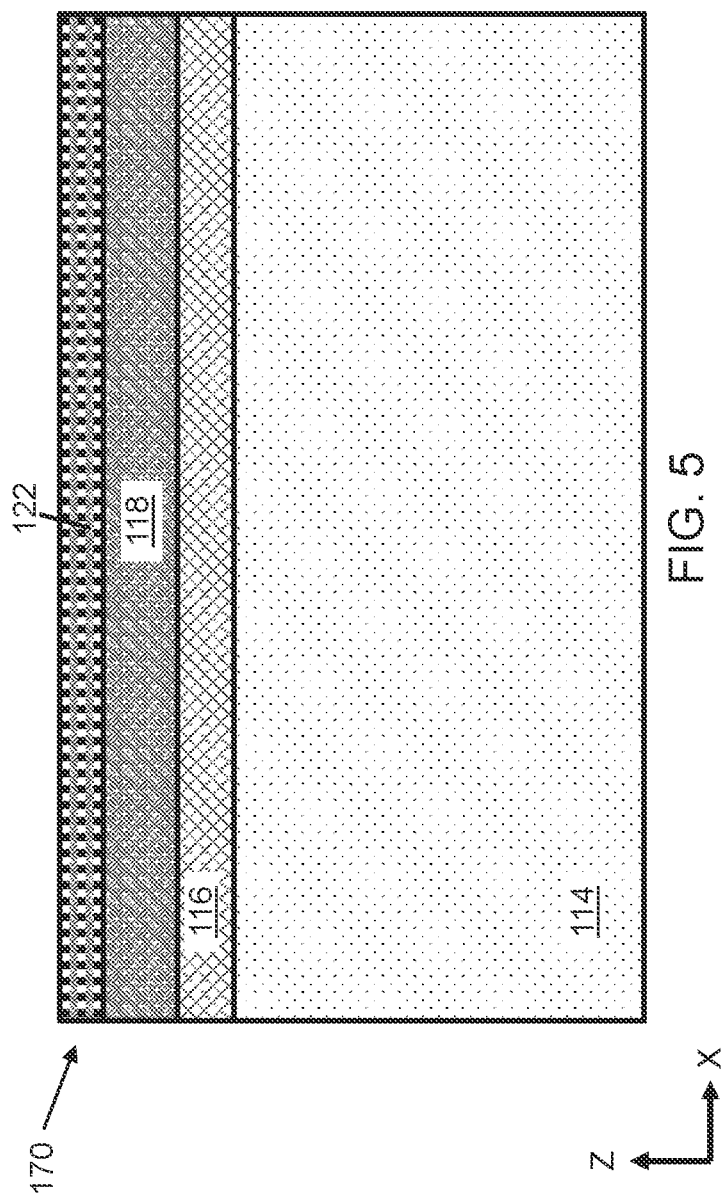
FIGS. 5-9 depict cross-sectional views in plane X-Z of methods to form a structure according to the disclosure.

Turning now to FIG. 5, embodiments of the disclosure include processing methodologies to form an electrically programmable fuse, e.g., efuse 102, within embodiments of structure 100. A preliminary structure 170 may include semiconductor substrate 114, with barrier layer 116 thereover as a single layer. Doped crystalline layer 118 may be on barrier layer 116 and metallic layer 122 may be on barrier layer 118. Notably, in some embodiments, isolation layer 120 (FIGS. 1-4) may not be initially present within preliminary structure 170. Layers 116, 118, 122 on semiconductor substrate 114 may be stacked such that there are no structural differences in preliminary structure 170 where efuse 102 (FIGS. 1-4) and transistor structure 150 (FIGS. 3, 4) will be formed.

Figure 6:
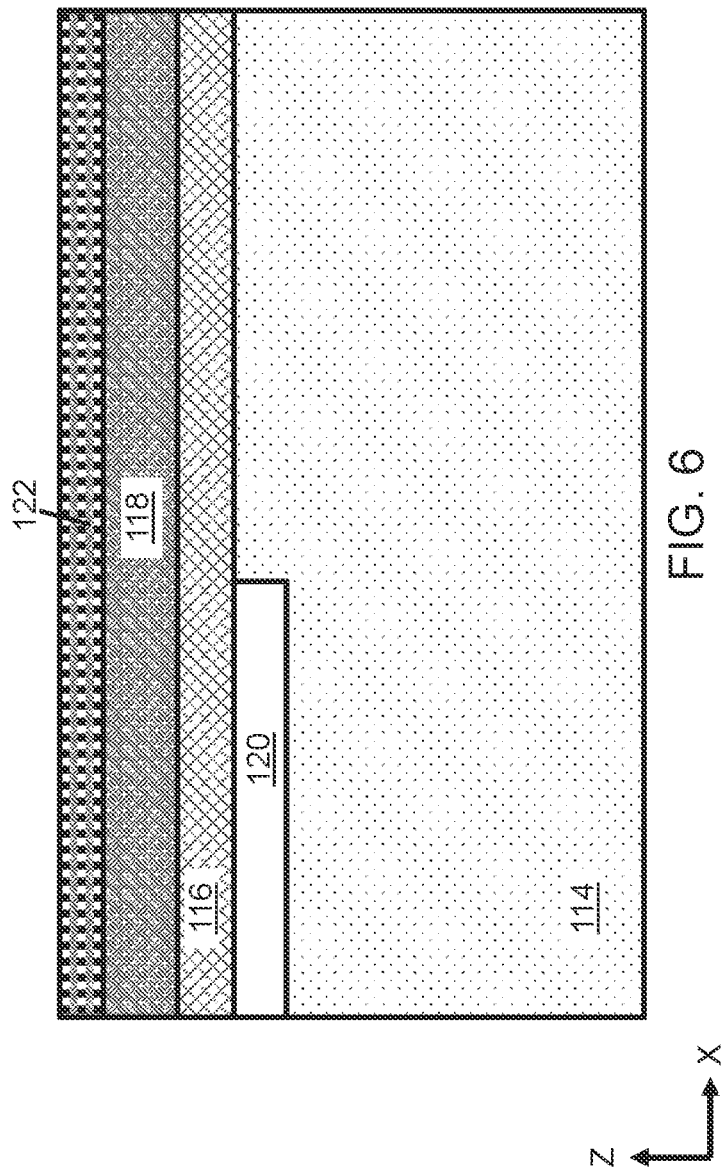

Referring to FIG. 6 methods of the disclosure may include forming isolation layer 120 on semiconductor substrate 114 but underneath barrier layer 116, even after doped crystalline layer 118 and metallic layer 122 have been formed. Isolation layer 120 may be formed, e.g., by implanting insulative materials (e.g., Nitrogen, Argon, and/or other similar materials currently known or later developed) such that they pass through layers 116, 118, 122 to enter the uppermost portions of semiconductor substrate 114. In the case where isolation layer 120 is formed by implantation of insulative materials, the implanted materials may convert some upper portions of semiconductor substrate 114 into isolation layer 120. As discussed elsewhere herein, the forming of isolation layer 120 may be implemented with the aid of masks and/or other patterning materials to form multiple isolation layers (e.g., isolation layers 120a, 120b, 120c shown in FIG. 4) on semiconductor substrate 114, and/or to prevent isolation layer 120 from being formed in locations where 2DEG region 152 (FIGS. 3, 4) is desired. In alternative implementations, isolation layer 120 may be formed before any of layers 116, 118, 122 are formed on semiconductor substrate 114.

Figure 7:
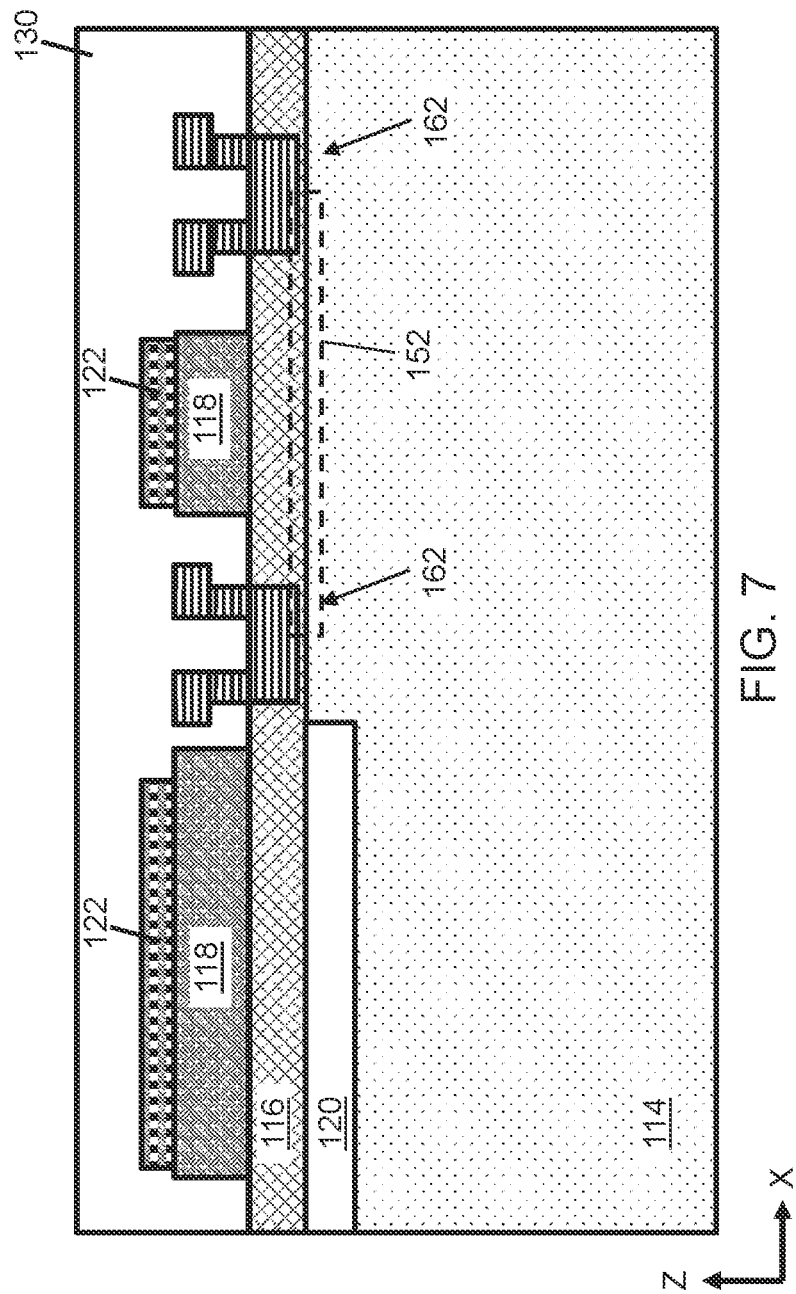

FIG. 7 depicts further processing to define portions of efuse 102 (FIGS. 1-4) and transistor structure 150 (FIGS. 3, 4) over semiconductor substrate 114. To further define the positions of efuse 102 and transistor structure 150, portions of layers 118, 122 can be removed such that two or more distinct layers 118, 122 are over barrier layer 116. The processing of layers 118, 122 may include, e.g., recessing TiN in metallic layer 122 and selectively etching the composition of doped crystalline layer 118 (e.g., pGaN). Ohmic contacts 162 can be formed on and within barrier layer 116, e.g., by removing portions of barrier layer 116 horizontally between layers 118, 122 and forming ohmic metals over isolation layer 120. In addition, a portion of MOL dielectric layer(s) 130 may be formed over layers 118, 120, 122 and ohmic contacts 162. MOL dielectric layer(s) 130 also may be planarized to yield a planar upper surface but may nonetheless cover metallic layer(s) 122, crystalline semiconductor layer(s) 118, and ohmic contacts 162.

Figure 8:
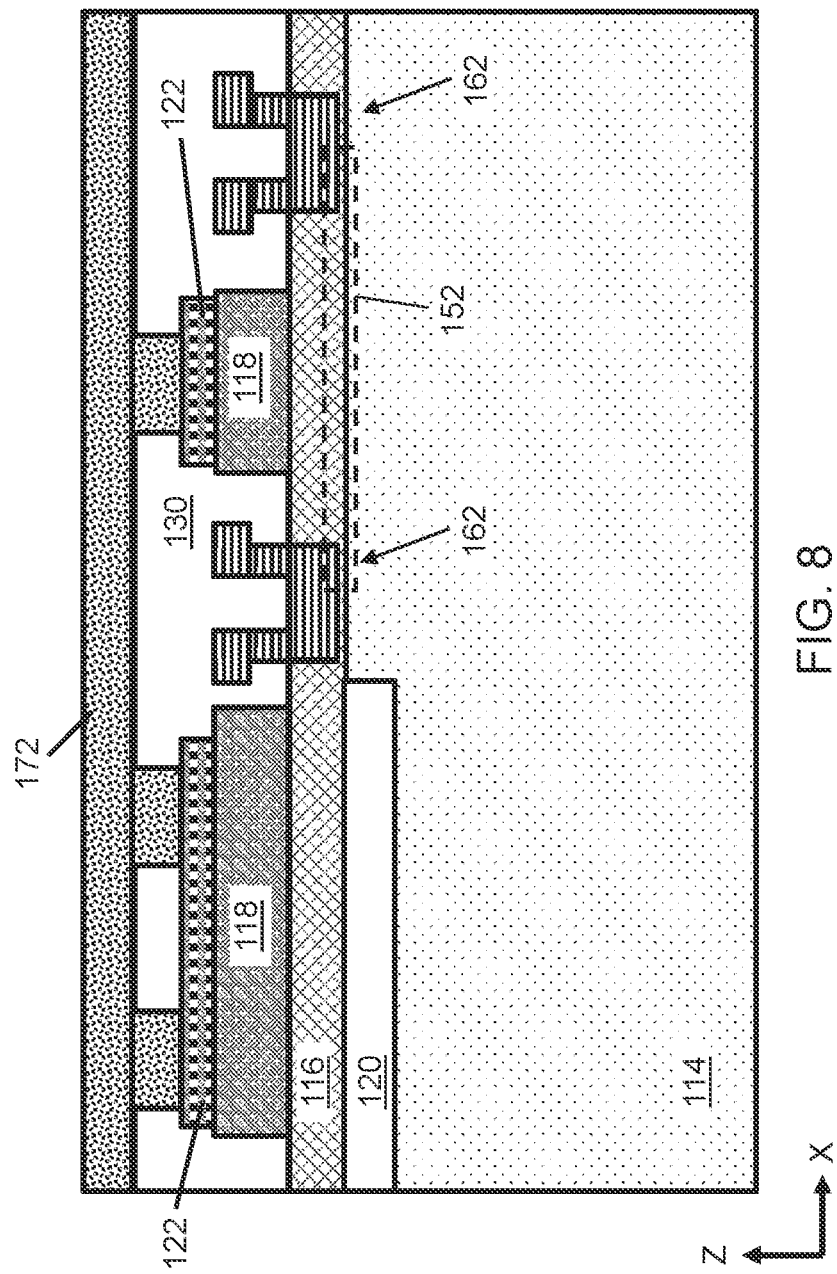

FIG. 8 depicts forming a gate conductor layer 172, e.g., by forming openings in MOL dielectric 130 to expose portions of metallic layers 122 and depositing conductive gate material(s) therein. The openings in MOL dielectric 130 over metallic layers 122 may be formed by targeted etching of MOL dielectric 130. Gate conductor layer 172 may have the same composition as gate conductor(s) 124 (FIGS. 1-4) discussed elsewhere herein. Upon being formed, gate conductor layer 172 may fill the openings over metallic layers 122 and cover MOL dielectric 130. Gate conductor layer 172 can be processed subsequently to define the cathode and anode of efuse 102 (FIGS. 1-4) and gate terminal of transistor structure 150 (FIGS. 3, 4).

Figure 9:
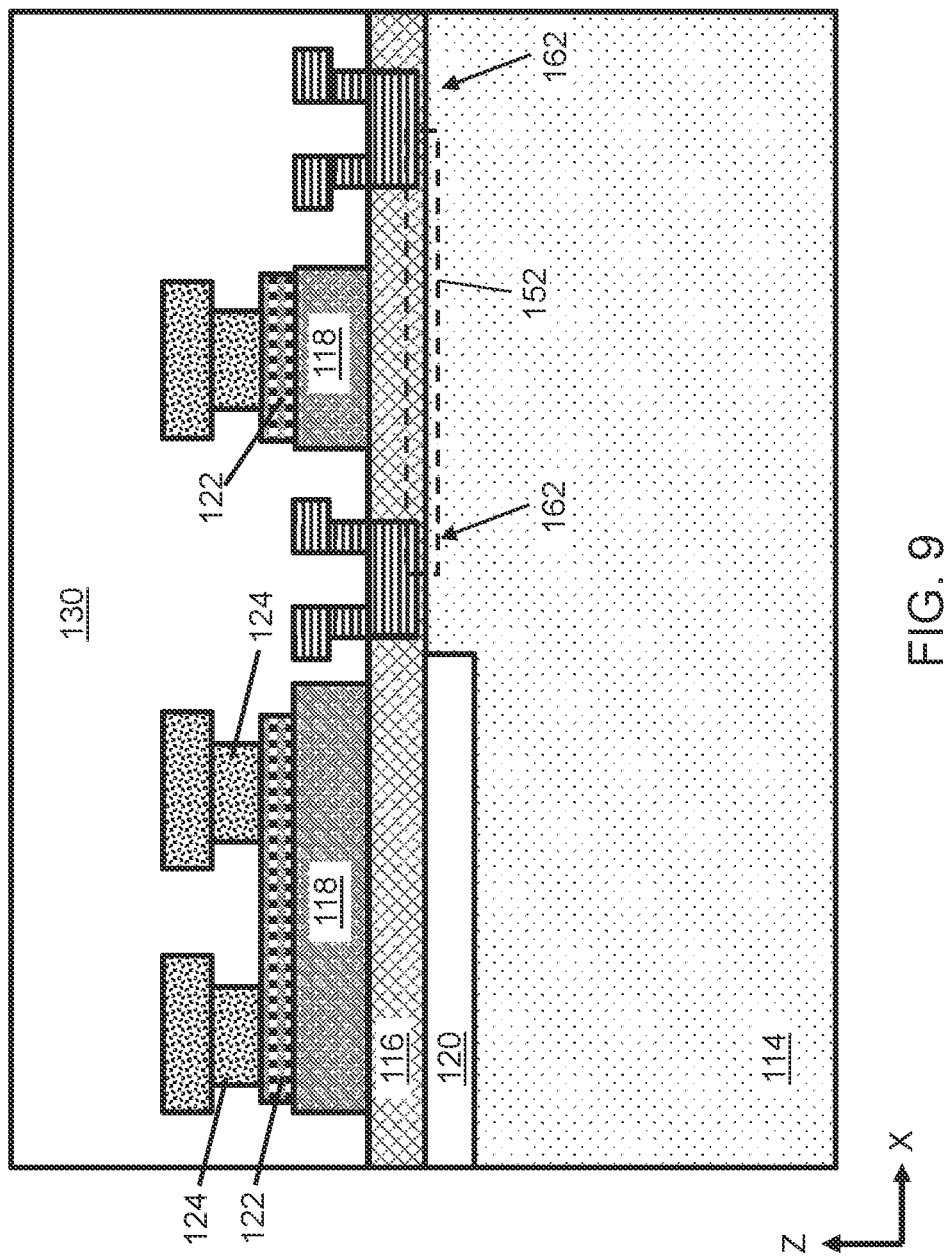

FIG. 9 depicts the processing of gate conductor layer 172 (FIG. 8), e.g., by selective etching of gate conductor material, to yield gate conductors 124 over each metallic layer 122. As shown in FIG. 9, an upper portion of each gate conductor 124 may overhang a lower portion of gate conductor 124 thereunder, e.g., due to the partial forming of gate conductor layer 172 on MOL dielectric 130. Additional portions of MOL dielectric 130 then may be formed to a desired height, thus covering gate conductors 124. At this stage of processing, additional openings may be formed within MOL dielectric 130 to form metal wires and vias, e.g., contacts 126 (FIGS. 1, 3, 4), conductors 128 (FIGS. 1, 3, 4), gate conductor(s) 154 (FIGS. 3, 4), and/or S/D contact(s) 164 (FIGS. 3, 4). Such processing may yield, e.g., structure 100 with the various structural features discussed herein, and including efuse 102 therein.

Embodiments of the disclosure provide various technical and commercial advantages, examples of which are discussed herein. Various devices having HEMTs therein, particularly those integrating GaN into power generation or amplification components, may be intended for use in various settings where efuses are desirable. As examples, circuitry to detect excessive temperatures may rely on efuses to cease operation of the circuit when temperature exceeds a threshold level, or programmable resistors may use efuses to encode logical functions prescribed by the user(s). Due to the need for such circuitry in power generation and amplification circuits, embodiments of the disclosure allow efuse hardware to be structurally integrated into the same portions of a device as HEMT structures and/or similar III-V device architectures without varying the type of semiconductor material(s) needed to provide these devices.

In the description of the structure embodiments above, reference is made to semiconductor features including, but not limited to, substrates, layers, regions, portions, terminals, etc. and to the conductivity types (e.g., P-type or N-type) of those features. Such features are made up of one or more semiconductor materials and a semiconductor material refers to a material whose conducting properties can be altered by doping with an impurity. Illustrative semiconductor materials include, for example, silicon-based semiconductor materials (e.g., silicon, silicon germanium, silicon germanium carbide, silicon carbide, etc.) and III-V compound semiconductors (i.e., compounds obtained by combining group III elements, such as aluminum (Al), gallium (Ga), or indium (In), with group V elements, such as nitrogen (N), phosphorous (P), arsenic (As) or antimony (Sb)) (e.g., GaN, InP, GaAs, or GaP). A pure semiconductor material and, more particularly, a semiconductor material that is not doped with an impurity for the purposes of increasing P-type or N-type conductivity is referred to in the art as an intrinsic semiconductor (i.e., an undoped semiconductor). A semiconductor material that is doped with an impurity for the purposes of increasing P-type or N-type conductivity is referred to in the art as an extrinsic semiconductor (i.e., a doped semiconductor). Such an extrinsic semiconductor will be P-type (i.e., will have P-type conductivity) or will be N-type (i.e., will have N-type conductivity) and will be more conductive than an intrinsic semiconductor made of the same base material. That is, extrinsic silicon will be more conductive than intrinsic silicon; extrinsic silicon germanium will be more conductive than intrinsic silicon germanium; and so on. Furthermore, different impurities (i.e., different dopants) can be used to achieve the different conductivity types (e.g., P-type conductivity and N-type conductivity) and the dopants may vary depending upon the different semiconductor materials used. For example, a silicon-based semiconductor material (e.g., silicon, silicon germanium, etc.) is typically doped with a Group III dopant, such as boron (B) or indium (In), to achieve P-type conductivity, whereas a silicon-based semiconductor material is typically doped a Group V dopant, such as arsenic (As), phosphorous (P) or antimony (Sb), to achieve N-type conductivity. A gallium nitride (GaN)-based semiconductor material is typically doped with magnesium (Mg) to achieve P-type conductivity and with silicon (Si) or oxygen to achieve N-type conductivity. Those skilled in the art will also recognize that different conductivity levels will depend upon the relative concentration levels of the dopant(s) in each semiconductor region.

The terminology used herein is for the purpose of describing the disclosed structures and methods and is not intended to be limiting. For example, as used herein, the singular forms "a," "an" and "the" are intended to include the plural forms as well, unless the context clearly indicates otherwise. Additionally, as used herein, the terms "comprises," "comprising," "includes," and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right," "left," "vertical," "horizontal," "top," "bottom," "upper," "lower," "under," "below," "underlying," "over," "overlying," "parallel," "perpendicular," etc., are intended to describe relative locations as they are oriented and illustrated in the drawings (unless otherwise indicated) and terms such as "touching," "in direct contact," "abutting," "directly adjacent to," "immediately adjacent to," etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element. The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
    a plurality of crystalline semiconductor layers, wherein each crystalline semiconductor layer includes a compound material;
    a metallic layer on the plurality of crystalline semiconductor layers, wherein the metallic layer has a lower resistivity than an uppermost layer of the plurality of crystalline semiconductor layers; and
    a pair of gate conductors on respective portions of the metallic layer, wherein the metallic layer defines an electrically programmable fuse (efuse) link between the gate conductors.

2. The structure of claim 1, wherein the plurality of crystalline semiconductor layers includes:
    an isolation layer on a portion of a gallium nitride (GaN) layer;
    an aluminum gallium nitride (AlGaN) layer on one of the isolation layer and the GaN layer; and
    a p-type gallium nitride (pGaN) layer on the AlGaN layer, wherein the pGaN layer is the uppermost layer of the plurality of crystalline semiconductor layers.

3. The structure of claim 2, wherein the GaN layer and the AlGaN layer are included within an adjacent transistor structure on the GaN layer.

4. The structure of claim 3, further comprising a conductor coupling one of the pair of gate conductors to a source/drain terminal of the adjacent transistor structure.

5. The structure of claim 2, wherein the isolation layer includes an amorphizing dopant species.

6. The structure of claim 1, wherein a resistivity of the metallic layer is less than a resistivity of the uppermost layer of the plurality of crystalline semiconductor layers.

7. The structure of claim 1, wherein the metallic layer includes titanium nitride (TiN).

8. An electrically programmable fuse (efuse) structure for a III-V semiconductor substrate, the efuse structure comprising:
    a crystalline aluminum gallium nitride (AlGaN) layer at least partially on an isolation layer and above the III-V semiconductor substrate;
    a crystalline gallium nitride (GaN) layer on the crystalline AlGaN layer;
    a titanium nitride (TiN) layer on the crystalline GaN layer; and a pair of gate conductors on respective portions of the TiN layer, wherein the TiN layer defines an electrically programmable fuse (efuse) link between the gate conductors.

9. The efuse structure of claim 8, wherein the III-V semiconductor substrate includes GaN.

10. The efuse structure of claim 8, wherein the AlGaN layer has an Al mole fraction of between approximately 15% and approximately 25%.

11. The efuse structure of claim 8, wherein the isolation layer includes an argon (Ar) dopant.

12. The efuse structure of claim 8, wherein the TiN layer is entirely above the isolation layer.

13. The efuse structure of claim 8, wherein a lower surface of the crystalline AlGaN layer includes an interface with the III-V substrate that does not include the isolation layer therebetween.

14. The efuse structure of claim 8, further comprising a transistor structure over the crystalline AlGaN layer and horizontally adjacent the TiN layer.

15. A method comprising:
  forming a plurality of crystalline semiconductor layers, wherein each crystalline semiconductor layer includes a compound material;
  forming a metallic layer on the plurality of crystalline semiconductor layers, wherein the metallic layer has a lower resistivity than an uppermost layer of the plurality of crystalline semiconductor layers; and
  forming a pair of gate conductors on respective portions of the metallic layer, wherein the metallic layer defines an electrically programmable fuse (efuse) link between the gate conductors.

16. The method of claim 15, wherein forming the plurality of crystalline semiconductor layers includes:
  forming an isolation layer on a portion of a gallium nitride (GaN) layer;
  forming an aluminum gallium nitride (AlGaN) layer on one of the isolation layer and the GaN layer; and
  forming a p-type gallium nitride (pGaN) layer on the AlGaN layer, wherein the pGaN layer is the uppermost layer of the plurality of crystalline semiconductor layers.

17. The method of claim 16, further comprising forming an adjacent transistor structure on the GaN layer, wherein the GaN layer and the AlGaN layer are included within the adjacent transistor structure.

18. The method of claim 16, wherein forming the metallic layer causes the metallic layer to be entirely above the isolation layer.

19. The method of claim 16, wherein forming the isolation layer includes introducing an amorphizing dopant species into the isolation layer.

20. The method of claim 15, wherein the metallic layer includes titanium nitride (TiN).

* * * * *